United States Patent
Ku

(10) Patent No.: US 8,811,100 B2
(45) Date of Patent: Aug. 19, 2014

(54) CELL ARRAY AND MEMORY DEVICE INCLUDING THE SAME

(71) Applicant: SK hynix Inc., Gyeonggi-do (KR)

(72) Inventor: Kie-Bong Ku, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 57 days.

(21) Appl. No.: 13/716,362

(22) Filed: Dec. 17, 2012

(65) Prior Publication Data
US 2014/0003173 A1 Jan. 2, 2014

(30) Foreign Application Priority Data
Jun. 28, 2012 (KR) ........................ 10-2012-0069901

(51) Int. Cl.
*G11C 7/00* (2006.01)
*G11C 11/4097* (2006.01)
*G11C 7/18* (2006.01)
*G11C 29/04* (2006.01)
*G11C 29/02* (2006.01)

(52) U.S. Cl.
CPC .............. *G11C 11/4097* (2013.01); *G11C 7/18* (2013.01); *G11C 29/04* (2013.01); *G11C 29/025* (2013.01)
USPC ........................... 365/200; 365/63; 365/210.1

(58) Field of Classification Search
CPC ...... G11C 11/4097; G11C 7/18; G11C 29/04; G11C 29/025
USPC ........................................ 365/200, 63, 210.1
See application file for complete search history.

(56) References Cited

U.S. PATENT DOCUMENTS

| | | | | |
|---|---|---|---|---|
| 5,448,516 A * | 9/1995 | Tsukikawa et al. | ........... | 365/182 |
| 6,088,279 A | 7/2000 | Ishii | | |
| 6,434,064 B2 * | 8/2002 | Nagai | ............. | 365/200 |
| 6,504,744 B2 * | 1/2003 | Aritomi et al. | ................... | 365/63 |
| 6,580,649 B2 * | 6/2003 | Park | ......................... | 365/189.07 |
| 6,894,917 B2 | 5/2005 | Ting et al. | | |
| 6,898,113 B2 * | 5/2005 | Tsuji | .............. | 365/158 |
| 6,982,912 B2 * | 1/2006 | Yamagami | .................... | 365/200 |
| 7,224,626 B2 * | 5/2007 | Oh | ................. | 365/200 |
| 7,286,431 B2 * | 10/2007 | Hidaka | ....................... | 365/189.14 |
| 7,474,550 B2 * | 1/2009 | Fujisawa et al. | ................ | 365/63 |
| 7,515,502 B1 * | 4/2009 | Ahsan et al. | ............. | 365/230.03 |
| 7,721,576 B2 * | 5/2010 | Amir | ............................. | 70/472 |
| 7,978,548 B2 * | 7/2011 | Cho | .............................. | 365/200 |
| 8,411,520 B2 * | 4/2013 | Lee et al. | ...................... | 365/201 |

* cited by examiner

*Primary Examiner* — Viet Q Nguyen
(74) *Attorney, Agent, or Firm* — IP & T Group LLP

(57) ABSTRACT

A memory cell array includes a plurality of normal word lines arranged at a first pitch, a plurality of repair word lines arranged at a second pitch, and a dummy boundary word line configured to be arranged between an outermost normal word line and an outermost repair word line.

10 Claims, 5 Drawing Sheets

NWL0
NWL1
NWL2
NWL3

⋮

NWL509
NWL510
NWL511
DWL_B
RWL0
RWL1
RWL2
RWL3
RWL4
RWL5
RWL6
RWL7

CELL ARRAY AND MEMORY DEVICE INCLUDING THE SAME

CROSS-REFERENCE TO RELATED APPLICATIONS

The present application claims priority of Korean Patent Application No. 10-2012-0069901, filed on Jun. 28, 2012, which is incorporated herein by reference in its entirety.

BACKGROUND

1. Field

Exemplary embodiments of the present invention relate to a cell array structure of a memory device, and more particularly, to a technology of substantially preventing data of a cell from being damaged due to coupling and the like between word lines of a memory device.

2. Description of the Related Art

[Background Art Related to Repair Operation of Memory Device]

FIG. 1 is a diagram for explaining a row repair operation in a conventional memory device.

Referring to FIG. 1, the memory device includes a cell array 110 including a plurality of memory cells, a row circuit 120 for activating word lines, and a row repair circuit 130 for a row repair operation.

The row repair circuit 130 stores row addresses, which designate normal word lines corresponding to failed memory cells in the cell array 110, as repair row addresses. For example, among 512 normal word lines NWL0 to NWL511, the row repair circuit 130 may store a row address corresponding to the third word line NWL3 and a row address corresponding to the 230$^{th}$ word line NWL230, as the repair row addresses. Furthermore, the row repair circuit 130 compares a row address R_ADD input from an exterior of the memory device with the stored repair row addresses. When the input row address R_ADD coincides with one of the stored repair row addresses, the row repair circuit 130 notifies the row circuit 120 of information indicating that the input row address R_ADD coincides with the stored repair row address.

The row circuit 120 activates a normal word line corresponding to the input row address R_ADD among the normal word lines NWL0 to NWL511 in an active operation. For example, when the row address R_ADD designates the fifth normal word line NWL5, the row circuit 120 activates the fifth normal word line NWL5. When the row circuit 120 is notified of information indicating that the input row address coincides with the repair row address from the row repair circuit 130, the row circuit 120 activates repair word lines RWL0 to RWL7 instead of the normal word lines NWL0 to NWL511. For example, when the input row address corresponds to the third word lines NWL3, the row repair circuit 130 notifies the row circuit 120 of information indicating that the input row address R_ADD coincides with the repair row address stored in the row repair circuit 130, and the row circuit 120 activates the 0$^{th}$ repair word line RWL0 instead of the third word line NWL3.

Through such an operation, among the normal word fines NWL0 to NWL511, failed normal word lines are replaced with the repair word lines RWL0 to RWL7. The number of the repair word lines may be changed according to design, and as the number of the repair word lines is increased, it is possible to repair many normal word lines.

[Background Art Related to Word Line Disturbance in Memory Device]

Meanwhile, as the degree of integration of the memory is increased, a pitch of a word line is gradually reduced, resulting in an increase in a coupling effect between word lines. Therefore, when the number of times, by which an activated state and a deactivated state of a word line are toggled, is increased, data of a memory cell connected to an adjacent word line may be damaged due to the coupling effect between word lines.

For example, in the case of a DRAM used as a main memory of a computer, a specific word line is repeatedly accessed many times (for example, 300K times) when the computer is booted, which frequently occurs. In such a case, due to electromagnetic waves generated by toggling of the specific word line repeatedly accessed, electrons are transferred to a capacitor of a cell connected to an adjacent word line or discharged from the capacitor, so that data may be damaged. Such a phenomenon is called a row hammer phenomenon.

SUMMARY

Exemplary embodiments of the present invention are directed to solve a row hammer phenomenon occurring in repair word lines for replacing failed word lines among normal word lines, as well as a row hammer phenomenon in the normal word lines.

In accordance with an embodiment of the present invention, a memory cell array includes a plurality of normal word lines arranged at a first pitch, a plurality of repair word lines arranged at a second pitch, and a dummy boundary word line arranged between an outermost normal word line and an outermost repair word line. Furthermore, pitches of word lines are substantially equal to one another, wherein the word lines include the plurality of normal word lines, the dummy boundary word line, and the plurality of repair word lines.

In accordance with another embodiment of the present invention, a memory cell array includes a plurality of normal word lines arranged at a first pitch, a plurality of repair word lines arranged at a second pitch, a dummy boundary word line configured to be arranged between an outermost normal word line and an outermost repair word line, and a plurality of dummy repair word lines configured to be arranged among adjacent repair word lines at a third pitch. Furthermore, pitches of all word lines are substantially equal to one another, wherein the word lines includes the plurality of normal word lines, the dummy boundary word line, the plurality of repair word lines, and the plurality of dummy repair word lines.

In accordance with further another embodiment of the present invention, a memory device includes a cell array including a plurality of normal word lines arranged at a first pitch, a plurality of repair word lines arranged at a second pitch, and a dummy boundary word line arranged between an outermost normal word line and an outermost repair word line, a row repair circuit configured to store a failed row address and compare an input row address with the stored failed row address, and a row circuit configured to activate a normal word line corresponding to the input row address among the plurality of normal word lines in an active operation, and to activate a repair word line corresponding to the stored failed row address without activating the normal word line when the row circuit is notified of information indicating that the row address input from the row repair circuit coincides with the stored failed row address.

According to the present invention, a dummy word line is arranged at the boundary between normal word lines and repair word lines, so that it is possible to substantially prevent a row hammer phenomenon between the outermost normal word line and the outermost repair word line.

Furthermore dummy repair word lines are arranged among repair word lines, so that it is not necessary to change separate circuit design for substantially preventing a row hammer phenomenon among the repair word lines.

DETAILED DESCRIPTION

Figure 1:
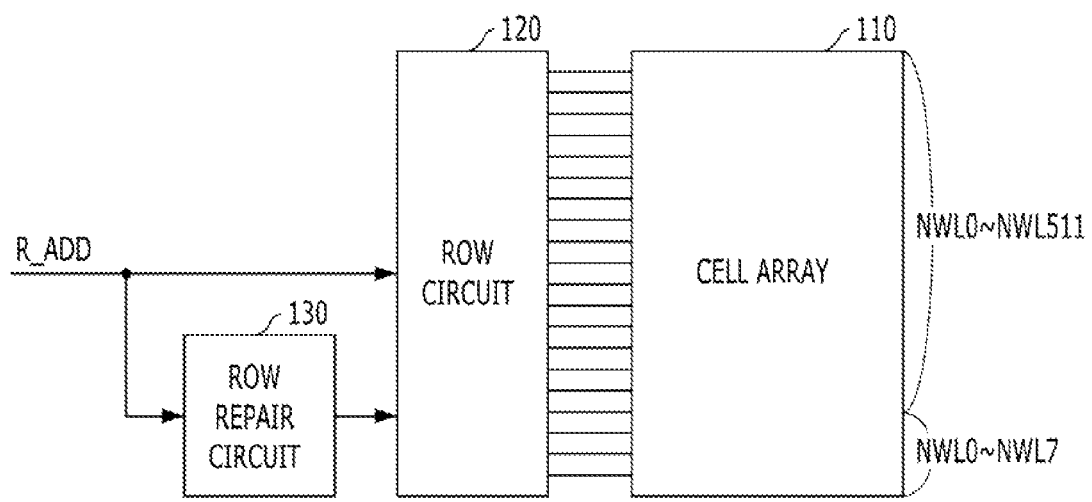
FIG. 1 is a diagram for explaining a row repair operation in a conventional memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled the art. Throughout the disclosure, like reference numerals refer to like parts throughout the various figures and embodiments of the present invention.

Figure 2:
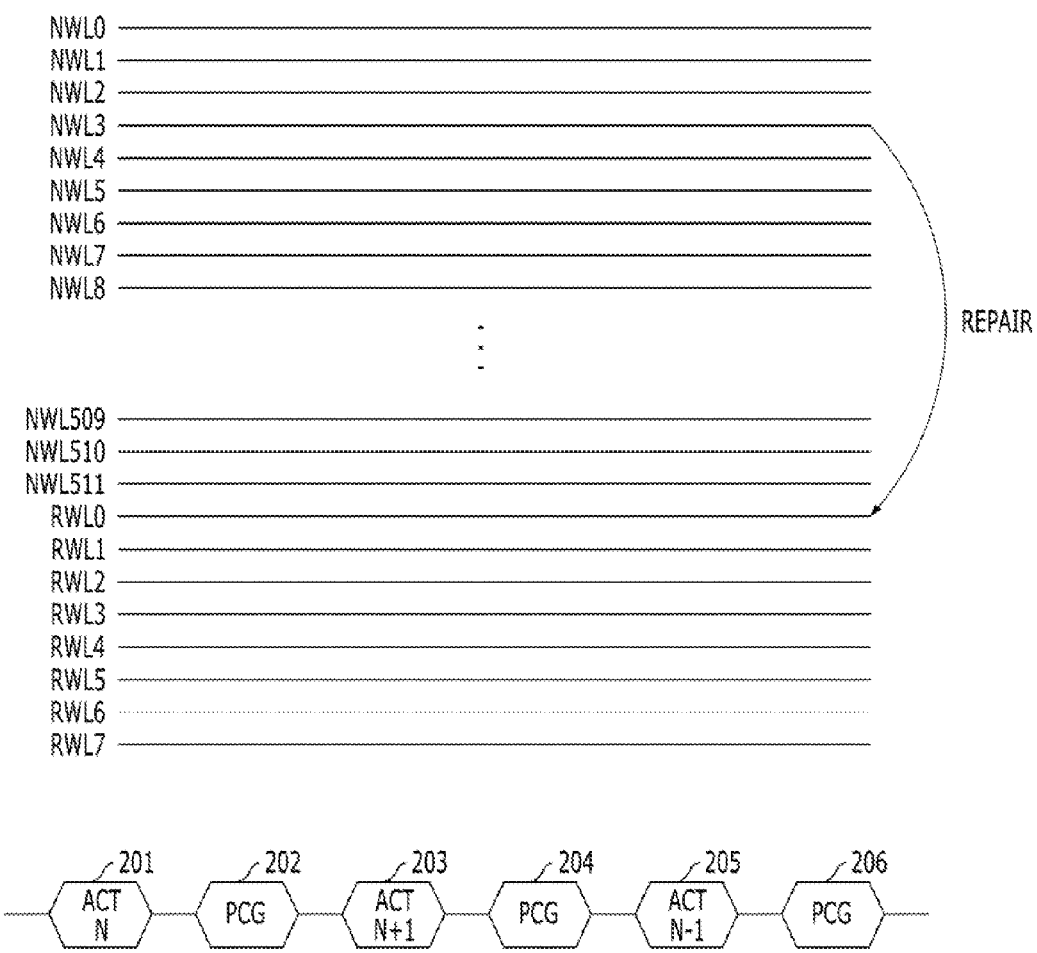
FIG. 2 is a diagram for explaining a method for preventing a row hammer phenomenon occurring in a memory device.

FIG. 2 is a diagram for explaining a method for preventing a row hammer phenomenon occurring in a memory device.

The lower portion of FIG. 2 shows a sequence of commands applied from a memory controller to the memory device in order to substantially prevent a row hammer phenomenon occurring in the memory device. When an $N^{th}$ row (word line) is repeatedly accessed beyond a prescribed number of times (for example, 300K times), the memory controller sequentially applies an "active command 201" for the $N^{th}$ row (applies a row address corresponding to the $N^{th}$ row together with the active command), a "precharge command 202", an "active command 203" for an $N+1^{th}$ row, a "precharge command 204", an "active command 205" for an $N-1^{th}$ row, and a "precharge command 206" to the memory device. The commands 201 to 206 applied from the memory controller are executed, so that it may be possible to substantially prevent the row hammer phenomenon occurring in the memory device. For example, when a seventh normal word line NWL7 is accessed beyond the prescribed number of times (for example, 300K times), a seventh normal word line NWL7, an eighth normal word line NWL8, and a sixth normal word line NWL6 are sequentially activated by the commands applied by the memory controller. That is, data of memory cells connected to the seventh normal word line NWL7, the eighth normal word line NWL8, and the sixth normal word line NWL6 are sequentially refreshed. Consequently, the data of the memory cells connected to the sixth normal word line NWL6 and the eighth normal word line NWL8, which has been degraded by the repeat access of the seventh normal word line NWL7, is recorded again, so that damage of the data is substantially prevented.

However, such a row hammer prevention method is not applicable to a repair word line. For example, when the memory controller accesses a third normal word line NWL3 beyond the prescribed number of times (for example, 300K times), since the third normal word line NWL3 has been replaced with a $0^{th}$ repair word line RWL0, the $0^{th}$ repair word line RWL0 is accessed beyond the prescribed number of times. In such a case, in order to substantially prevent the row hammer phenomenon, the memory controller sequentially applies the "active command 201" for a third row, the "precharge command 202", the "active command 203" for a fourth row, the "precharge command 204", the "active command 205" for a second row, and the "precharge command 206" to the memory device. Then, in the memory device, the $0^{th}$ repair word line RWL0, a fourth normal word line NWL4, and a second normal word line NWL2 are sequentially activated. In order to substantially prevent the row hammer phenomenon, a $511^{th}$ normal word line NWL511 and a first repair word line RWL1, which are physically adjacent to the $0^{th}$ repair word line RWL0 accessed beyond the prescribed number of times, should be activated, but the word lines NWL4 and NWL2 are activated.

In order to substantially prevent the row hammer phenomenon occurring in the repair word line, circuits for performing the following functions may need to be added to the memory device: (1) a function of activating a repair word line adjacent to a repair word line corresponding to the first active command 201, instead of the second active command 203 and the third active command 205, when the first active command 201 corresponds to the repair word line in the case in which the memory controller applies the sequence of the commands 201 to 206 for substantially preventing the row hammer phenomenon to the memory device; (2) a function of additionally activating the $0^{th}$ repair word line RWL0 when the first active command 201 corresponds to the final normal word line NWL511; and (3) a function of additionally activating the final normal word line NWL511 when the first active command 201 corresponds to the $0^{th}$ repair word line RWL0. However, in order to provide a circuit for performing all the functions (1) to (3), changing the design of the memory device is very inconvenient. Particularly, according to the functions (2) and (3) since the repair word line and the normal word line are mixed for control, designing a circuit for supporting the functions (2) and (3) and providing the circuit to the memory device may cause a large design change and an area increase of the memory device.

In this regard, the present invention substantially prevents the row hammer phenomenon occurring in the repair word line by changing the structure of a cell array.

Figure 3:
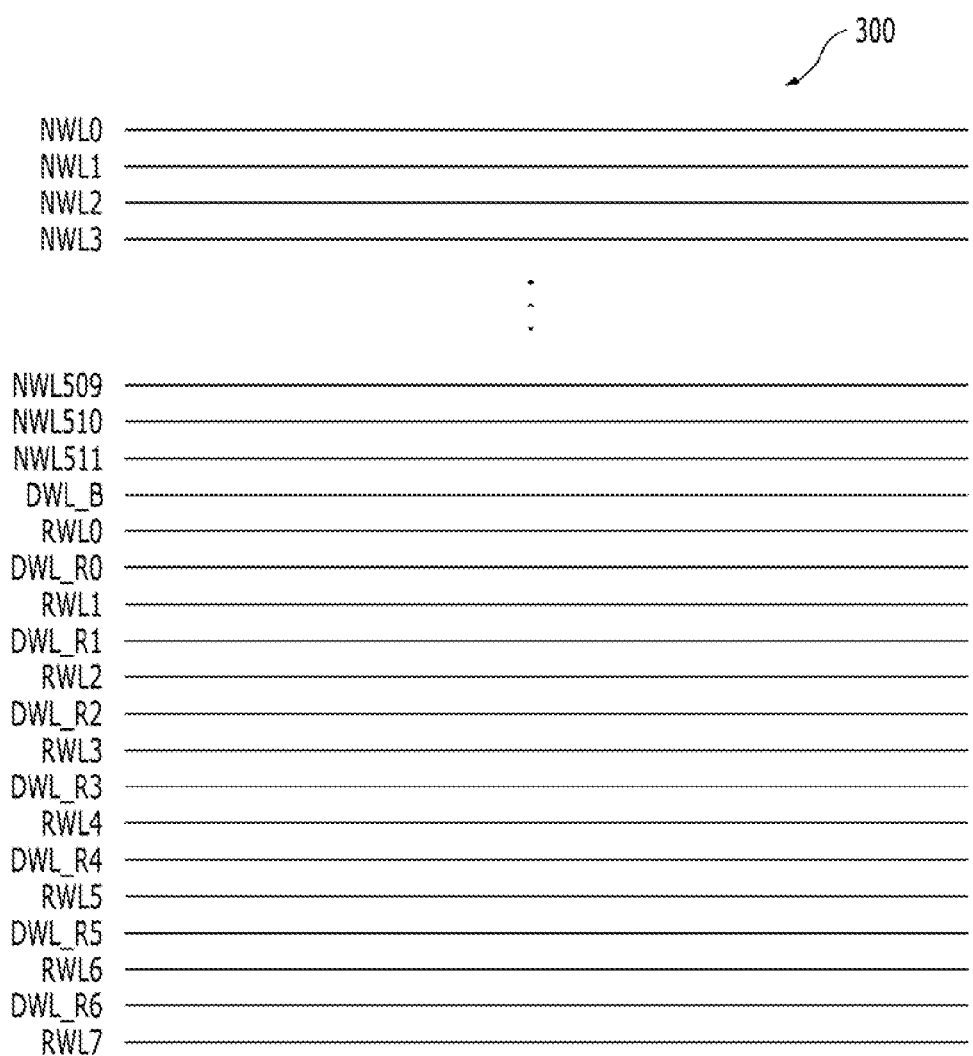
FIG. 3 is a diagram illustrating a memory cell array in accordance with an embodiment of the present invention.

FIG. 3 is a diagram of a memory cell array 300 in accordance with an embodiment of the present invention. The cell array 300 includes bit lines, cell transistors, cell capacitors and the like, in addition to the word lines. However, since the present invention relates to the structure of word lines, for easy description, the above elements will not be illustrated herein.

Referring to FIG. 3, the cell array 300 includes a plurality of normal word lines NWL0 to NWL511, a plurality of repair word lines RWL0 to RWL7, a dummy boundary word line DWL_B, and a plurality of dummy repair word lines DWL_R0 to DWL_R6.

The normal word lines NWL0 to NWL511 are arranged at a predetermined interval. The dummy boundary word line DWL_B is arranged below the outermost normal word line NWL511 of the normal word lines NWL0 to NWL511. The repair word lines RWL0 to RWL7 and the dummy repair word lines DWL_R0 to DWL_R6 are alternately arranged below the dummy boundary word line DWL_B. Pitches of all word lines, which includes the normal word lines NWL0 to NWL511, the dummy boundary word line DWL_B, the repair word lines RWL0 to RWL7, and the dummy repair word lines DWL_R0 to DWL_R6, may be substantially equal to one another. Furthermore, the fact that the pitches of all the word lines are substantially equal to one another represents that a pitch between adjacent word lines is constantly maintained. For example a pitch between the normal word line NWL4 and the normal word line NWL5, a pitch between the normal word line NWL511 and the dummy boundary word line DWL_B, a pitch between the dummy boundary word line DWL_B and the repair word line RWL0, and a pitch between the repair word line RWL1 and the dummy repair word line DWL_R0 are substantially equal to one another.

The dummy boundary word line DWL_B is inserted in order to solve the row hammer phenomenon between the outermost normal word line NWL511 and the repair word line RWL0. Even in the case in which the normal word line NWL511 is repeatedly accessed many times and the repair word line RWL0 is repeatedly accessed many times due to the dummy boundary word line DWL_B, it is possible to substantially prevent the occurrence of the row hammer phenomenon that damages data. That is, it may be not necessary to provide the circuit for supporting the aforementioned functions (2) and (3) to the memory device. Furthermore, the dummy repair word lines DWL_R0 to DWL_R6 solve the row hammer phenomenon among the repair word lines RWL0 to RWL7. By inserting the dummy repair word lines DWL_R0 to DWL_R6, it may be not necessary to consider the row hammer phenomenon among the repair word lines RWL0 to RWL7. That is, it may be not necessary to provide the circuit for supporting the aforementioned function (1) to the memory device.

Memory cells (dummy memory cells) may be connected to the dummy boundary word line DWL_B and the dummy repair word lines DWL_R0 to DWL_R6. However, a circuit for driving word lines is not connected to the dummy boundary word line DWL_B and the dummy repair word lines DWL_R0 to DWL_R6, and failed normal word lines of the normal word lines NWL0 to NWL511 are not replaced with the dummy boundary word line DWL_B or the dummy repair word lines DWL_R0 to DWL_R6. The dummy boundary word line DWL_B and the dummy repair word lines DWL_R0 to DWL_R6 may be fixed to a predetermined voltage (for example, a ground voltage) level in a normal operation.

Furthermore, dummy word lines (not illustrated) for the balance of pattern formation of the cell array 300 may further be provided above the uppermost normal word line NWL0 and below the lowermost repair word line RWL7. Such dummy word lines are provided in order to substantially prevent edge patterns of the cell array 300 from being non-uniformly formed, other than the purpose of substantially preventing the row hammer phenomenon.

Figure 4:
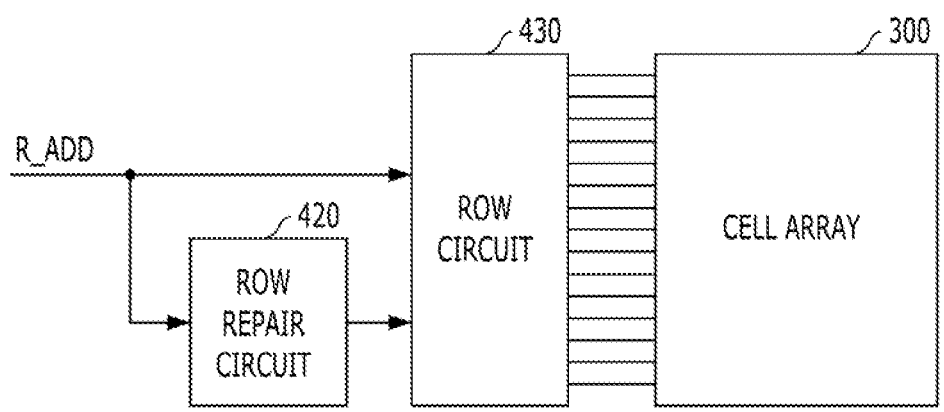
FIG. 4 is a diagram illustrating a memory device in accordance with an embodiment of the present invention.

FIG. 4 is a diagram of the memory device in accordance with an embodiment of the present invention.

Referring to FIG. 4, the memory device includes the cell array 300, a row repair circuit 420, and a row circuit 430.

As described in FIG. 3, the cell array 300 includes the normal word lines NWL0 to NWL511, the repair word lines RWL0 to RWL7, the dummy boundary word line DWL_B, and the dummy repair word lines DWL_R0 to DWL_R6.

The row repair circuit 420 is configured to store row addresses, which designate normal word lines corresponding to failed memory cells in the cell array 300, as repair row addresses. For example, among the 512 normal word lines NWL0 and NWL511, the total eight (substantially equal to the number of repair word lines) row addresses, which include a row address corresponding to the third word line NWL3, a row address corresponding to the seventieth word line NWL70, a row address corresponding to the 113$^{th}$ word line NWL113 and the like, may be stored as the repair row addresses in the row repair circuit 420. Furthermore, when the row address R_ADD input from an exterior of the memory device coincides with one of the stored repair row addresses, the row repair circuit 420 notifies the row circuit 430 of information indicating that the input roar address R_ADD coincides with the stored repair row address.

The row circuit 430 is configured to activate a normal word line corresponding to the input row address R_ADD among the normal word lines NWL0 and NWL511. For example, when the input row address R_ADD is an address that designates the fifth normal word line NW5, the row circuit 430 activates the fifth normal word line NW5. When the row circuit 430 is notified of the information indicating that the row address R_ADD input from the row repair circuit 420 coincides with the repair row address, the row circuit 430 activates the repair row address instead of the normal word line. For example, when the input row address R_ADD corresponds to the third normal word line NW3, the row repair circuit 420 notifies the row circuit 430 of the information indicating that the input row address R_ADD coincides with the repair row address stored in the row repair circuit 420, and the row circuit 430 activates the 0$^{th}$ repair word line NW0 instead of the third normal word line NW3.

Through the aforementioned operation, among the normal word lines NWL0 and NWL511, failed normal word lines are replaced with the repair word lines RWL0 to RWL7. The number of the repair word lines RWL0 to RWL7 may be changed according to design, and as the number of the repair word lines is increased, it is possible to repair many normal word lines.

According to the present invention, in order to substantially prevent the row hammer phenomenon among the repair word lines RWL0 to RWL7 and the raw hammer phenomenon between the outermost normal word line NWL511 and the repair word line RWL0, the dummy word lines DWL_B and DWL_R0 to DWL_R6 are inserted into the cell array 300. Consequently, even without a change in the design of the row circuit 430 and the row repair circuit 420, that s, even when the row circuit 430 and the row repair circuit 420 do not support the functions (1) to (3), it may be possible to substantially prevent the row hammer phenomenon related to the repair word lines RWL0 to RWL7.

Figure 5:
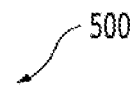
FIG. 5 is a diagram illustrating a cell array 500 in accordance with another embodiment of the present invention.

FIG. 5 is a diagram of a cell array 500 in accordance with another embodiment of the present invention. The cell array 500 includes bit lines, cell transistors, cell capacitors and the like, in addition to word lines. However, since the present invention relates to the structure of word lines, the above elements will not be illustrated.

Referring to FIG. 5, the cell array 500 includes a plurality of normal word lines NWL0 to NWL511, a plurality of repair word lines RWL0 to RWL7, and a dummy boundary word line DWL_B.

The normal word lines NWL0 to NWL511 are arranged at a predetermined interval. The dummy boundary word line DWL_B is arranged below the outermost normal word line NWL511 of the normal word lines NWL0 to NWL511. The repair word lines RWL0 to RWL7 are arranged below the dummy boundary word line DWL_B. Line pitches of all word lines including the normal word lines NWL0 to NWL511, the dummy boundary word line DWL_B, and the repair word lines RWL0 to RWL7 may be substantially equal to one another. Furthermore, the fact that the line pitches of all the word lines are substantially equal to one another represents that a pitch between adjacent word lines is constantly maintained. For example, a pitch between the normal word line NWL4 and the normal word line NWL5, a pitch between the normal word line NWL511 and the dummy boundary word line DWL_B, and a pitch between the dummy boundary word line DWL_B and the repair word line RWL0, and a pitch between the repair word line RWL0 and the repair word line RWL1 are substantially equal to one another.

The dummy boundary word line DWL_B is inserted in order to solve the row hammer phenomenon between the outermost normal word line NWL511 and the repair word line RWL0. Even in the case in which the normal word line NWL511 is repeatedly accessed many times and the repair word line RWL0 is repeatedly accessed many times due to the dummy boundary word line DWL_B, it is possible to substantially prevent the occurrence of the row hammer phenomenon that damages data. That is, it is not necessary to provide the circuit for supporting the aforementioned functions (2) and (3) to the memory device.

In FIG. 5, the dummy repair word lines, which are indicated by DWL_R0 to DWL_R6 in FIG. 3, are not inserted among the repair word lines RWL0 to RWL7. Thus, in order to substantially prevent the row hammer phenomenon among the repair word lines RWL0 to RWL7, it is necessary to provide the circuit for supporting the aforementioned function (1) to the memory device. However, since the function (1) is easily realized as compared with the functions (2) and (3) and does not cause a design change and an area increase of the memory device, only the dummy boundary word line is inserted, so that it is possible to significantly reduce a burden of a design change of the memory.

Furthermore, dummy word lines (not illustrated) for the balance of pattern formation of the cell array 500 may further be provided above the uppermost normal word line NWL0 and below the lowermost repair word line RWL7. Such dummy word lines are provided in order to substantially prevent edge patterns of the cell array 500 from being non-uniformly formed, other than the purpose of substantially preventing the row hammer phenomenon.

While the present invention has been described with respect to the specific embodiments, it will be apparent to those skilled in the art that various changes and modifications may be made without departing from the spirit and scope of the invention as defined in the following claims.

What is claimed is:

1. A memory cell array comprising:
a plurality of normal word lines arranged at a first pitch;
a plurality of repair word lines arranged at a second pitch; and
a dummy boundary word line arranged between an outermost normal word line and an outermost repair word line.

2. The memory cell array of claim 1, wherein pitches of the word lines are substantially equal to one another,
wherein the word lines include the plurality of normal word lines, the dummy boundary word line, and the plurality of repair word lines.

3. A memory cell array comprising:
a plurality of normal word lines arranged at a first pitch;
a plurality of repair word lines arranged at a second pitch;
a dummy boundary word line arranged between an outermost normal word line and an outermost repair word line; and
a plurality of dummy repair word lines arranged among adjacent repair word lines at a third pitch.

4. The memory cell array of claim 3, wherein pitches of word lines are substantially equal to one another,
wherein the word lines include the plurality of normal word lines, the dummy boundary word line, the plurality of repair word lines, and the plurality of dummy repair word lines.

5. A memory device comprising:
a cell array including a plurality of normal word lines arranged at a first pitch, a plurality of repair word lines arranged at a second pitch, and a dummy boundary word line arranged between an outermost normal word line and an outermost repair word line;
a row repair circuit configured to store a failed row address and compare an input row address with the stored failed row address; and
a row circuit configured to activate a normal word line corresponding to the input row address among the plurality of normal word lines in an active operation, and to activate a repair word line corresponding to the stored failed row address without activating the normal word line when the row circuit is notified of information indicating that the row address input from the row repair circuit coincides with the stored failed row address.

6. The memory device of claim 5, wherein pitches of word lines are substantially equal to one another,
wherein the word lines includes the plurality of normal word lines, the dummy boundary word line, and the plurality of repair word lines.

7. The memory device of claim 5, wherein the cell array further comprises:
a plurality of dummy repair word lines configured to be arranged among adjacent repair word lines at a third pitch.

8. The memory device of claim 7, wherein pitches of all word lines are substantially equal to one another,
wherein the word lines include the plurality of normal word lines, the dummy boundary word line, the plurality of repair word lines, and the plurality of dummy repair word lines.

9. A memory cell array comprising:
a plurality of normal word lines arranged at a first pitch;
a plurality of repair word lines arranged at a second pitch; and
a dummy boundary word line arranged between a normal word line and a repair word line adjacent to the normal word line.

10. The memory cell array of claim 9, wherein pitches of the word lines are substantially equal to one another,
wherein the word lines include the plurality of normal word lines, the dummy boundary word line, and the plurality of repair word lines.

* * * * *